United States Patent
Aita et al.

(10) Patent No.: US 6,931,209 B2
(45) Date of Patent: Aug. 16, 2005

(54) REMOTE COMMANDER

(75) Inventors: Masanori Aita, Chiba (JP); Masayuki Kihara, Saitama (JP)

(73) Assignee: Sony Corporation, Tokyo (JP)

( * ) Notice: Subject to any disclaimer, the term of this patent is extended or adjusted under 35 U.S.C. 154(b) by 629 days.

(21) Appl. No.: 10/011,822

(22) Filed: Nov. 6, 2001

(65) Prior Publication Data

US 2002/0093597 A1 Jul. 18, 2002

(30) Foreign Application Priority Data

Nov. 8, 2000 (JP) ....... P2000-340638

(51) Int. Cl.$^7$ .......... H04B 10/00; H04B 10/04
(52) U.S. Cl. .......... 398/106; 398/120; 398/185
(58) Field of Search .......... 398/106, 111, 398/182, 164; 327/31, 35, 310, 309, 276, 238, 25, 29.014, 29.015, 38.02, 38.03, 38.07; 340/825.65, 825.57, 825.63, 825.69, 825.72

(56) References Cited

U.S. PATENT DOCUMENTS

| | | | | |
|---|---|---|---|---|
| 4,814,741 A | * | 3/1989 | Hongo et al. | 340/825.65 |
| 5,438,328 A | * | 8/1995 | Kweon | 340/825.57 |
| 5,870,380 A | * | 2/1999 | Diehl et al. | 370/212 |
| 6,020,729 A | * | 2/2000 | Stratakos et al. | 323/283 |
| 6,344,874 B1 | * | 2/2002 | Helms et al. | 348/164 |

FOREIGN PATENT DOCUMENTS

JP 08204983 A * 8/1996 ........... H04N/5/00

* cited by examiner

Primary Examiner—Leslie Pascal
Assistant Examiner—Dalzid Singh
(74) Attorney, Agent, or Firm—Jay H. Maioli

(57) ABSTRACT

A remote commander in which a switching element connected in series to an infrared light-emitting diode is turned on and off in response to carrier pulses to energize the infrared light-emitting diode to generate an infrared remote control signal includes varying means for varying duty ratios of carrier pulses.

2 Claims, 5 Drawing Sheets

REMOTE COMMANDER

BACKGROUND OF THE INVENTION

1. Field of the Invention

The present invention relates to a remote commander for controlling audio-visual device such as a television receiver and a video tape recorder by using an infrared light-emitting diode from a distance.

2. Description of the Related Art

Heretofore, there has been proposed a remote commander for controlling audio-visual devices such as a television receiver (TV) and a video cassette recorder (VCR) by using an infrared light-emitting diode from a distance. FIG. 1 shows an outward appearance of such remote commander.

FIG. 2 is a diagram showing a circuit arrangement of such related-art remote commander. As shown in FIG. 1, there is provided a key device 1 including a keypad on which there are disposed various keys such as a power key, numerical keys and a volume control key. When a user operates a certain key on the keypad of the key device 1, a key signal corresponding to depression of a certain key is generated from the key device 1 and supplied to a switching signal generating circuit 2. The switching signal generating circuit 2 formed by a microcomputer modulates a carrier pulse having a frequency of 40 kHz in response to a key signal in a predetermined modulation manner to generate a switching signal. A duty ratio of this carrier pulse is generally selected to be 1/3.

A switching signal obtained at the output side of the switching signal generating circuit 2 is supplied to the base of an npn transistor 3 comprising a switching element so that the npn transistor 3 is turned on and off in response to the carrier pulse of this switching signal. The emitter of the npn transistor 3 is connected to the ground, the collector of the npn transistor 3 is connected to the cathode of an infrared light-emitting diode 4, and the anode of the infrared light-emitting diode 4 is connected through a current-restriction resistor 5 to a power supply at a terminal 7, to which a supply voltage Vcc is connected.

As shown in FIG. 3, in the infrared light-emitting diode 4, an intensity of a light output Po emitted from the infrared light-emitting diode 4 is in proportion to a current I, and the light output Po increases as the current I flowing through the infrared light-emitting diode 4 increases.

Now, this kind of remote commander is designed so as to become relatively small in size and light in weight so that this remote commander may become convenient for portable use. For this reason, since the small and light-weight remote commander may be operated by a suitable small battery such as a button cell, it has been requested that the remote commander should have less power consumption.

Although it has been proposed to decrease the current I flowing through the infrared light-emitting diode 4 in order to decrease the power consumption of the remote commander, when the current I flowing through the infrared light-emitting diode 4 decreases, the intensity of the light output Po decreases as shown in FIG. 3 with the result that a distance which an infrared remote control signal transmitted from the remote commander can reach is inevitably reduced. There is then a disadvantage that the remote commander will not be operated well.

To remove this disadvantage encountered with the related-art remote commander, there is proposed another example of a remote commander according to the related art as shown in FIG. 4. In FIG. 4, elements and parts identical to those of FIG. 2 are identified by identical reference numerals.

As shown in FIG. 4, the anode of the infrared light-emitting diode 4 is connected through a current-restriction first resistor 5a having a resistance of 6.8 ohms, for example, to one fixed contact 6a of a change-over switch 6, and the anode of the infrared light-emitting diode 4 is connected through a current-restriction second resistor 5b having a resistance of 16.8 ohms, for example, to the other fixed contact 6b of the change-over switch 6. A movable contact 6c of the change-over switch 6 is connected to the power supply at the terminal 7 to which the supply voltage Vcc is connected. Accordingly, when the movable contact 6c of the change-over switch 6 is changed-over, the remote commander may be switched to a normal power consumption mode (when the movable contact 6c is connected to one fixed contact 6a) and a low power consumption mode (when the movable contact 6c is connected to the other fixed contact 6b).

Therefore, even in the case the remote commander is not operated well when a low power consumption mode is applied, the disadvantage is prevented by switching over the low power consumption mode to a normal power consumption mode.

However, since the power consumption mode switching circuit is comprised of the second resistor 5b, the change-over switch 6 and the like as described above, the number of assemblies of the remote commander inevitably increases and extra cost is required so that the remote commander cannot be produced inexpensively.

Furthermore, let us consider a transmission distance which a remote control signal from this remote commander can reach is reduced when the remote commander is formed as the low power consumption type remote commander. Assuming now that the resistance of the first resistor 5a is 6.8 ohms and that the resistance of the second resistor 5b is 16.8 ohms, then we have:

normal power consumption:low power consumption= 100:40 normal power consumption transmission distance:low power consumption transmission distance=1:0.63

As a result, the distance which the remote control signal can cover is reduced and operability of this remote commander is degraded distinctly.

SUMMARY OF THE INVENTION

In view of the aforesaid aspect, it is an object of the present invention to provide a remote commander in which a distance which an infrared remote control signal can reach (intensity of an infrared output) can be prevented from being decreased and in which a power consumption can be reduced without increasing the number of assemblies.

According to an aspect of the present invention, there is provided a remote commander in which a switching element connected in series to an infrared light-emitting diode is turned on and off in response to carrier pulses to energize the infrared light-emitting diode to generate an infrared remote control signal. This remote commander comprises a varying device for varying duty ratios of the carrier pulses.

According to the present invention, since the duty ratio of the carrier pulse which turns on and off the switching element can be varied, the duty ratio of the carrier pulse can be decreased to "1/4", for example. When the duty ratio of the carrier pulse is decreased, a time period in which a current I is flowing through the infrared light-emitting diode can be decreased and therefore a power consumption of the remote commander can be reduced. Furthermore, since the value of the current which flows through the infrared light-emitting diode when the carrier pulse is held at high "1" level (when the switching element is turned on) is constant, the light output Po of the infrared light-emitting diode is not lowered substantially and is made constant, and the transmission distance of this infrared remote control signal is not decreased substantially.

Furthermore, since the duty ratio of this carrier pulse can be varied by using software of the microcomputer, extra assemblies are not needed.

DESCRIPTION OF THE PREFERRED EMBODIMENT

Figure 1:
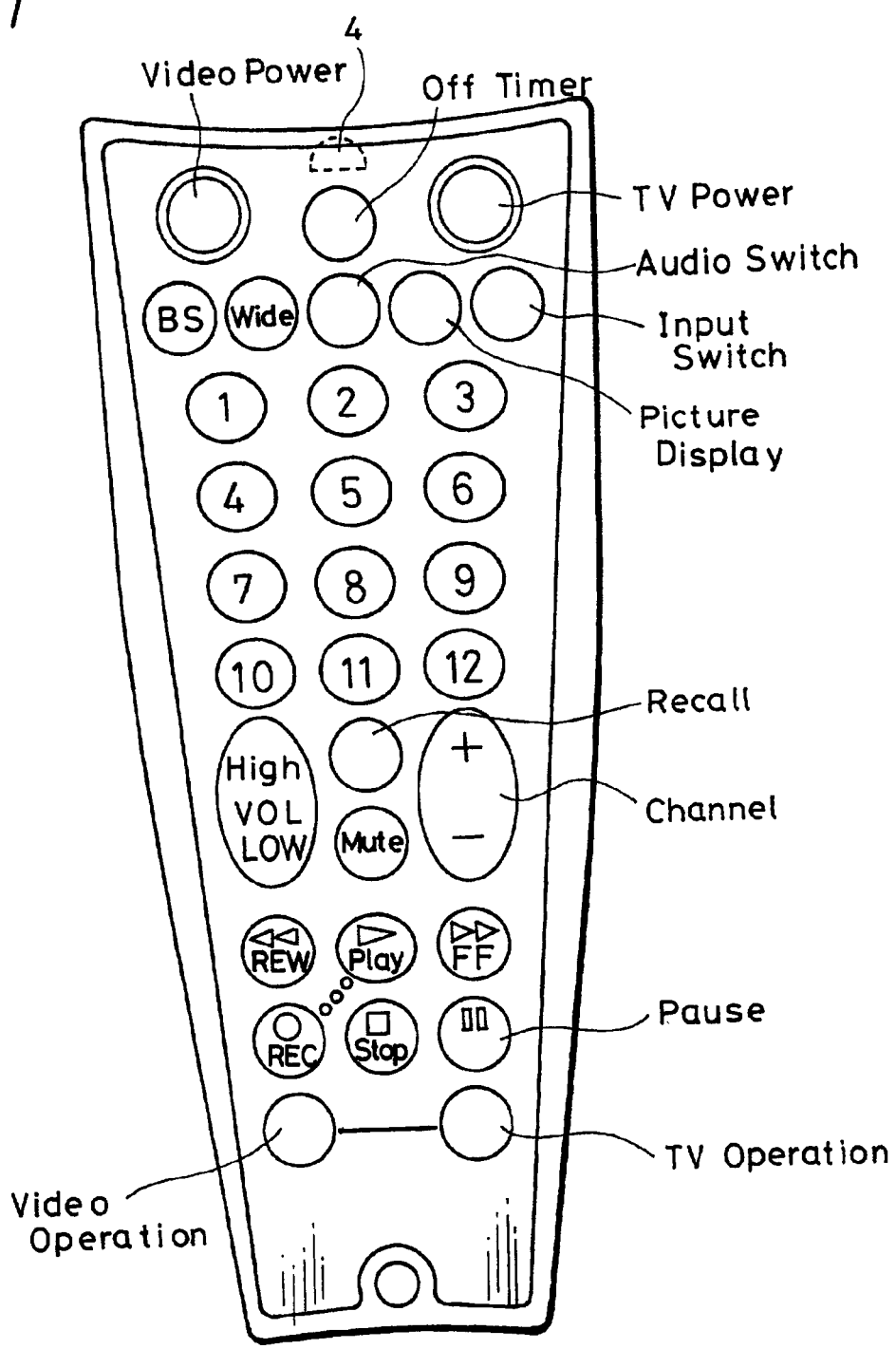
FIG. 1 is a plan view showing an outward appearance of a remote commander.
Figure 2:
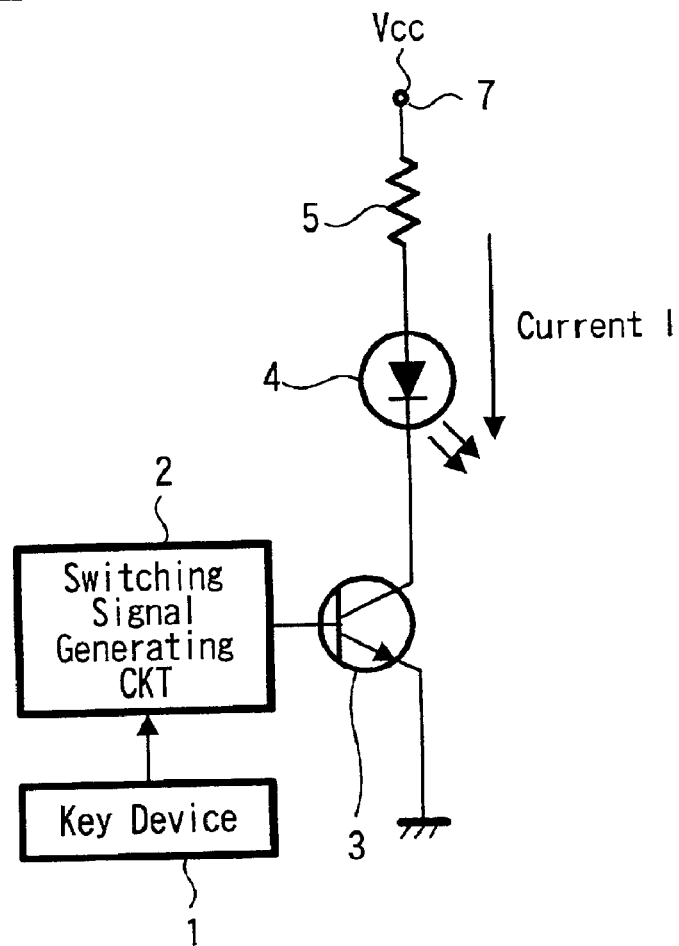
FIG. 2 is a diagram showing an example of a circuit arrangement of a remote commander according to the related art.
Figure 3:
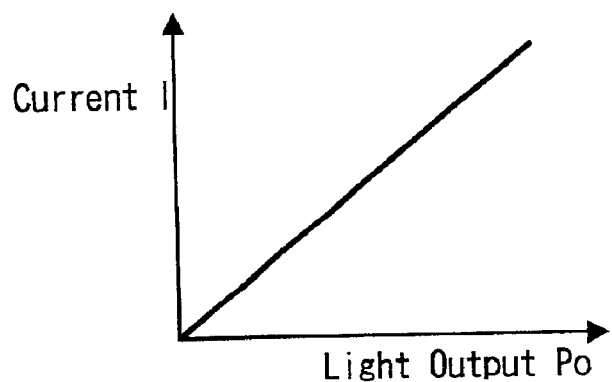
FIG. 3 is a diagram to which reference will be made in explaining an infrared light-emitting diode of a remote commander according to the related art.
Figure 4:
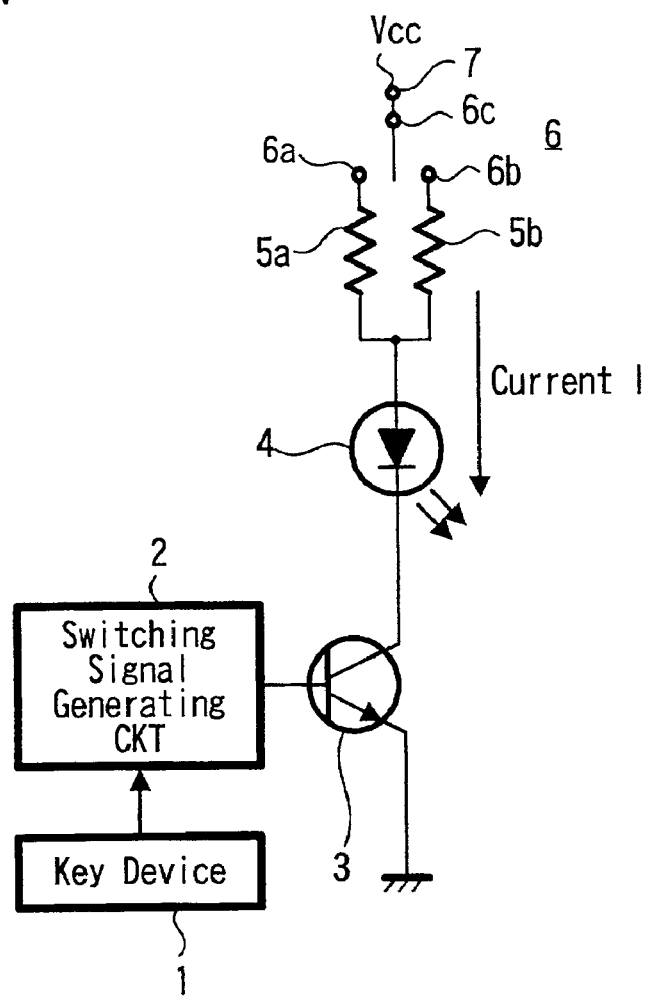
FIG. 4 is a diagram showing another example of a circuit arrangement of a remote commander according to the related art.
Figure 5:
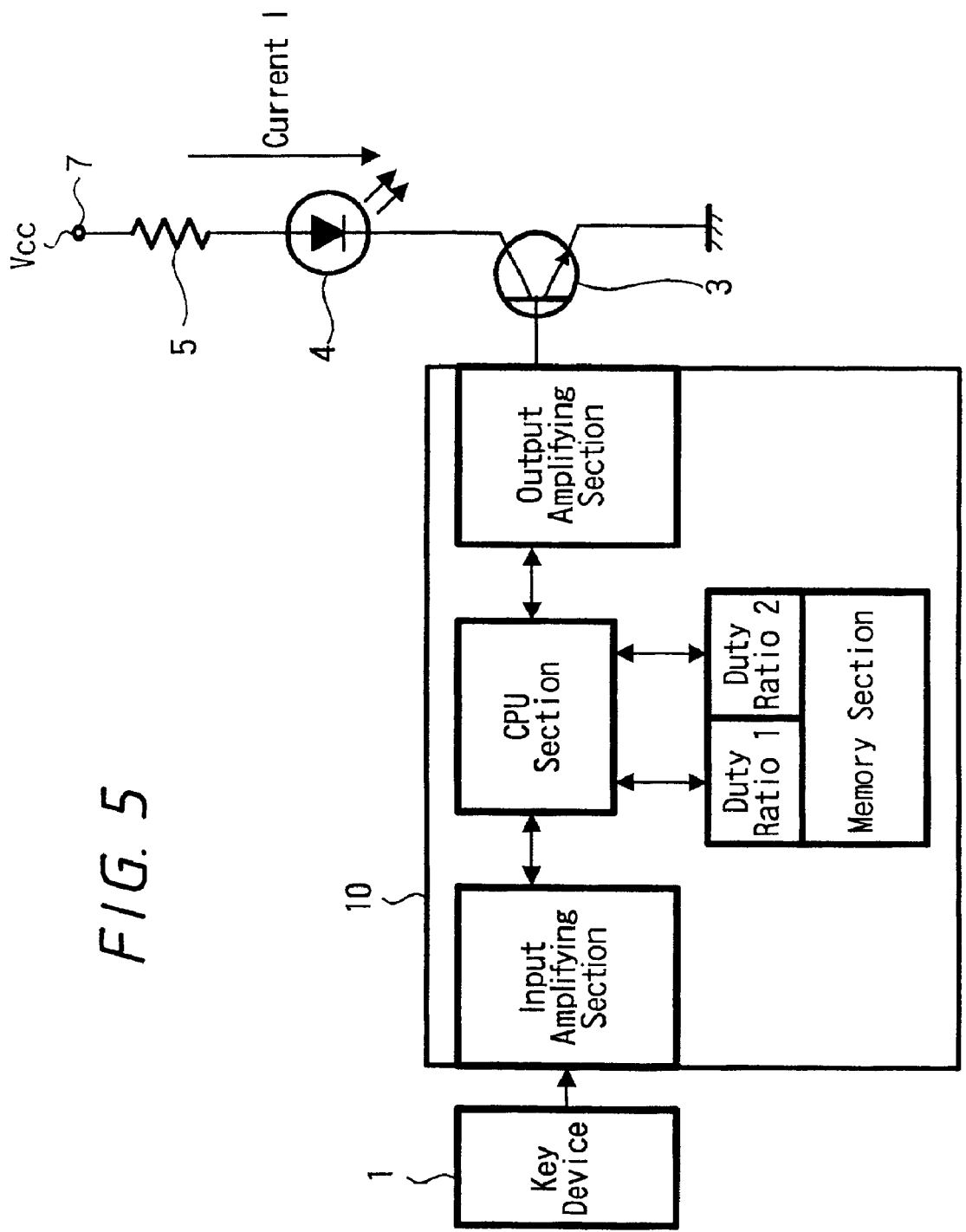
FIG. 5 is a schematic block diagram showing a circuit arrangement of a remote commander according to an embodiment of the present invention.

A remote commander according to an embodiment of the present invention will be described below with reference to FIGS. 5 to 7. In FIG. 5, elements and parts identical to those of FIG. 2 are identified by the identical reference numerals.

In the embodiment shown in FIG. 5, a key signal generated when a user operates suitable keys such as a power key, numerical keys and a volume control key on the keypad of the key device 1 is supplied to a switching signal generating circuit 10 comprised of a one-chip microcomputer. This switching signal generating circuit 10 generates a switching signal by modulating a carrier pulse having a frequency of 40 kHz, for example, in response to a remote control key signal in a predetermined manner.

In this embodiment, the key device 1 includes a power consumption mode switching key for switching the normal power consumption mode and a low power consumption mode although not shown. At the same time, the switching signal generating circuit 10 switches a duty ratio of a carrier pulse to "1/3" (normal power consumption mode) and "1/4" (low power consumption mode) based upon software installed on a microcomputer.

Figure 6A:
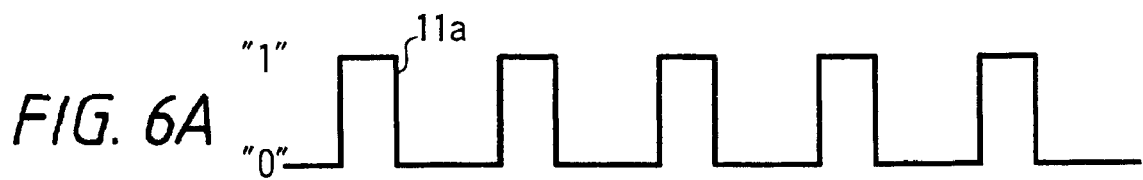
FIGS. 6A and 6B are diagrams of waveforms of carrier pulses and to which reference will be made in explaining the present invention, respectively.
Figure 6B:
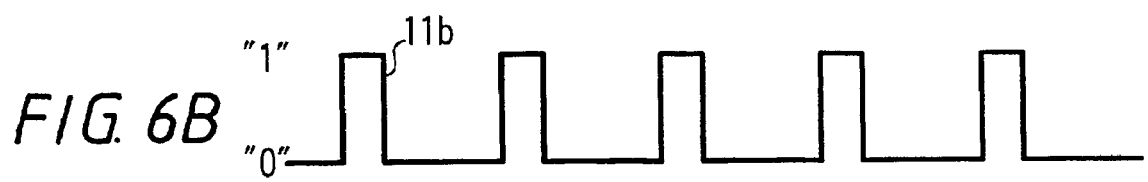

Specifically, when a user instructs the normal power consumption mode by keys on the keypad of the key device 1, the switching signal generating circuit 10 sets a duty ratio of a carrier pulse 11a comprising the switching signal to "1/3" based upon the software installed on the microcomputer as shown in FIG. 6A. When on the other hand a user instructs the low power consumption mode by keys on the keypad of the key device 1, the switching signal generating circuit 10 sets a duty ratio of a carrier pulse 11b comprising the switching signal to "1/4" based upon the software installed on the microcomputer as shown in FIG. 6B.

Figure 7:
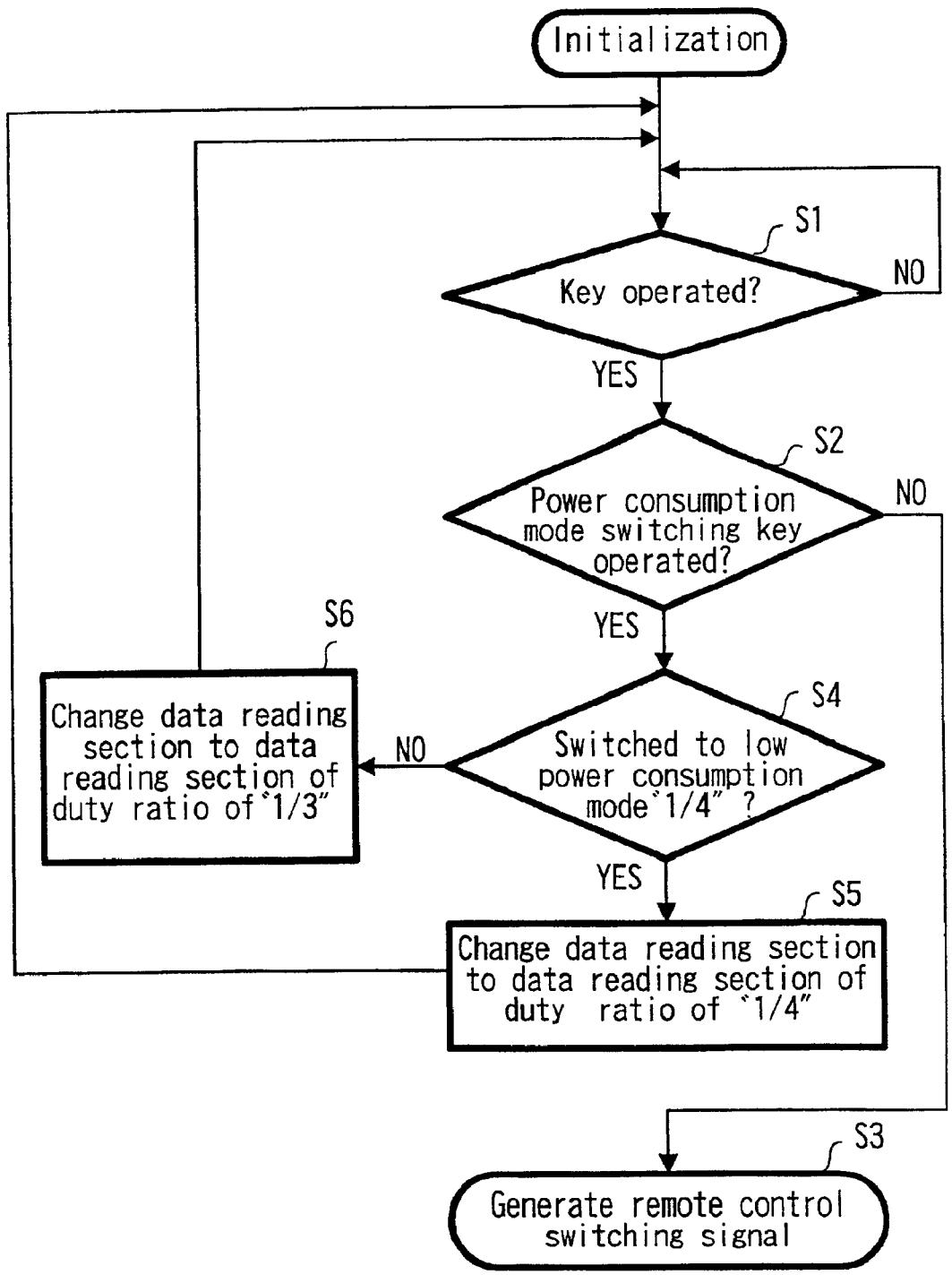
FIG. 7 is a flowchart to which reference will be made in explaining operations of the remote commander according to the present invention.

The switching signal generating circuit 10 switches the duty ratio of the carrier pulse comprising the switching signal in accordance with a flowchart of FIG. 7.

Referring to FIG. 7, and following the initialization, it is determined at the next decision step S1 by the microcomputer (CPU (central processing unit) section) in the switching signal generating circuit 10 whether or not the key on the keypad of the key device 1 is operated. If the key is operated as represented by a YES at the decision step S1, then control goes to the next decision step S2. If on the other hand the key is represented by a NO at the decision step S1, then the decision step S1 is repeated. Then, it is determined at the decision step S2 whether or not the operated key is the power consumption mode switching key. If the operated key is not the power consumption mode switching key as represented by a NO at the decision step S2, then control goes to a step S3, whereat the switching signal generating circuit 10 generates a remote control switching signal corresponding to a key signal of the operated key.

If on the other hand the power consumption mode switching key is operated as represented by a YES at the decision step S2, then control goes to the next decision step S4, whereat it is determined whether or not the remote commander is switched to the low power consumption mode (duty ratio of "1/4"). If the remote commander is switched to the low power consumption mode as represented by a YES at the decision step S4, then control goes to a step S5, whereat the microcomputer changes the data reading section to the data reading section of the duty ratio "1/4". If the remote commander is not switched to the low power consumption mode as represented by a NO at the decision step S4, then control goes to a step S6, whereat the microcomputer changes the data reading section to the data reading section of the duty ratio "1/3". Then, control goes back to before the decision step S1. Thus, the duty ratio of the carrier pulse can be determined.

Referring back to FIG. 5, the switching signal developed at the output side of the switching signal generating circuit 10 is supplied to the base of the npn transistor 3 comprising the switching element so that the npn transistor 3 is turned on and off in response to the carrier pulses of the switching signal.

In this case, the npn transistor 3 is turned on when the carrier pulses 11a, 11b are held at high "1" level and turned off when the carrier pulses 11a, 11b are held at low "0" level as shown in FIGS. 6A and 6B.

The emitter of the npn transistor 3 is connected to the ground, the collector of the npn transistor 3 is connected to the cathode of the infrared light-emitting diode 4, and the anode of the infrared light-emitting diode 4 is connected through the resistor 5 having the resistance of 6.8 ohms, for example, to the power supply at the terminal 7, at which the supply voltage Vcc is connected.

According to this embodiment, when the carrier pulses 11a, 11b of the switching signal are held at high "1" level, the npn transistor 3 is turned on so that the infrared light-emitting diode 4 is energized by the current I. Thus, the infrared light-emitting diode 4 emits the light output Po.

In the case the duty ratio of the carrier pulse of the switching signal is decreased from "1/3" to "1/4", although the value of the current I which flows through the infrared light-emitting diode 4 when the carrier pulse 11b of the duty ratio "1/4" is held at high "1" level is always constant, a time period in which the current I is flowing through the infrared light-emitting diode 4 is decreased and an integrated value of the current I and the time period in which the current I is flowing through the infrared light-emitting diode 4 is decreased, which can therefore decrease the power consumption of the remote commander.

In this case, since the value of the current I which flows through the infrared light-emitting diode 4 when the carrier pulses 11a, 11b are held at high "1" level is not changed by the duty ratios of the carrier pulses 11a, 11b, the light output Po from the infrared light-emitting diode 4 is substantially the same and the transmission distance which the infrared remote control signal from the remote commander can reach is also substantially the same.

Since the duty ratios of "1/4" and "1/3" of the carrier pulses 11a, 11b of the switching signal are switched based upon the software installed on the microcomputer, even when the decreased duty ratio causes a trouble on the operations of the remote commander (when the pulse of the infrared light-emitting diode 4 has poor responsiveness, the intensity of the light output Po from the light-emitting diode 4 may be lowered), placing the remote commander in the normal power consumption mode by switching the power consumption mode based upon the software of the microcomputer in the key device 1, the duty ratio of the carrier pulse can be set to "1/3". Therefore, the above-mentioned problem can be solved.

Furthermore, according to this embodiment, since the duty ratios of "1/3" and "1/4" of the carrier pulses 11a, 11b of the switching signal are switched based upon the software of the microcomputer, extra assemblies are not needed, which is advantageous for manufacturing the remote commander inexpensively.

Having described a preferred embodiment of the invention with reference to the accompanying drawings, it is to be understood that the invention is not limited to that precise embodiment and that various changes and modifications could be effected therein by one skilled in the art without departing from the spirit or scope of the invention as defined in the appended claims.

What is claimed is:

1. A remote commander in which a switching element connected in series to an infrared light-emitting diode is turned on and turned off in response to carrier pulses to energize said infrared light-emitting diode to generate an infrared remote control signal, said remote commander comprising:

a switching signal generating circuit for generating said carrier pulses fed to said switching element and including power consumption mode switching means for selecting a first duty ratio mode in which a duty ratio of said carrier pulses is a first predetermined value and for selecting a second duty ratio mode in which the duty ratio of said carrier pulses is a second predetermined value less than said first predetermined value.

2. The remote commander according to claim 1, wherein said power consumption mode switching means comprises software installed on a microcomputer.

* * * * *